United States Patent [19]
Salmonson et al.

[11] Patent Number: 5,805,418
[45] Date of Patent: Sep. 8, 1998

[54] COOLING CAP METHOD AND APPARATUS FOR TAB PACKAGED INTEGRATED CIRCUITS

[75] Inventors: Richard B. Salmonson, Chippewa Falls; Stephen Cermak, III, Elk Mound, both of Wis.

[73] Assignee: Cray Research, Inc., Eagan, Minn.

[21] Appl. No.: 604,918

[22] Filed: Feb. 22, 1996

[51] Int. Cl.⁶ ........................................................ H05K 7/20
[52] U.S. Cl. .................. 361/704; 165/80.2; 165/80.3; 165/185; 174/16.3; 257/713; 257/718
[58] Field of Search ................................ 165/80.2, 80.3, 165/185; 174/16.3; 257/706, 707, 712, 713, 718, 719, 726, 727; 361/704, 707, 709–710, 715, 717–722

[56] References Cited

U.S. PATENT DOCUMENTS

| | | | |
|---|---|---|---|
| 4,321,423 | 3/1982 | Johnson et al. | 174/16.3 |
| 4,593,342 | 6/1986 | Lindsay | 361/720 |
| 4,849,856 | 7/1989 | Funari et al. | 361/719 |
| 5,014,904 | 5/1991 | Morton | 228/176 |
| 5,410,451 | 4/1995 | Hawthorne et al. | 361/719 |

OTHER PUBLICATIONS

IBM Tech. Disclosure Bulletin "Film On Metal Leaded Chip Carrier" vol. 31, No. 1, Jun. 1988 pp. 2–3 (361/719).

*Primary Examiner*—Gregory D. Thompson
*Attorney, Agent, or Firm*—Schwegman, Lundberg Woessner and Kluth, P.A.

[57] ABSTRACT

The present invention discloses a method and apparatus for bridging the gap between an integrated circuit package or component mounted on a circuit board and a heat sink such that there is little stress placed on the component, but there is still a connection between the component and the heat sink for dissipation of heat. The invention provides mechanical integrity for delicate component packages, and in doing so allows for the use of a variety of heat sinks to provide cooling. A printed circuit board has integrated circuit packages or other components mounted to the circuit board. A cooling cap comprised of a thermally conductive material is mounted on the circuit board, such that the component is enveloped by the circuit board and cooling cap. A layer of thermally conductive material may be deposited between the component and the cooling cap to provide a thermally conductive path from the component to the cooling cap. Risers, which may be either integral to the cooling cap or separate elements, are used to lift the cooling cap above the surface of the circuit board so as to provide space for the component.

9 Claims, 6 Drawing Sheets

COOLING CAP METHOD AND APPARATUS FOR TAB PACKAGED INTEGRATED CIRCUITS

STATEMENT REGARDING GOVERNMENT FIGHTS

The present invention was made with government support under MDA 972-95-3-0032, awarded by ARPA. The Government has certain rights in this invention.

FIELD OF THE INVENTION

The present invention relates to electronic circuit board designs and more specifically to an apparatus and method for providing mechanical integrity for a cooling device that is mounted over a component on a printed circuit board.

BACKGROUND OF THE INVENTION

In the field of computers, integrated circuit packages or components mounted on circuit boards require power for operation. This power consumption leads to heat generation. This heat generation creates the need for a cooling apparatus to keep the temperature of the circuits in the required range for operation.

The common device used to cool the components mounted on a printed circuit board is a heat sink that runs either along the top or the bottom side of the circuit board. These heat sinks may be either air or liquid cooled. In order to ensure that the heat flows freely from the heat producing component to the heat sink, only a small gap between the heat producing component and the heat sink may be allowed.

For common style integrated circuit package designs, the heat sink attaches directly to the surface of the package. These common style package designs include pin grid array, flat packs, ball grid arrays, and other styles known to those skilled in the art. These common style packages are durable enough so that the heat sink may attach directly to the package surface without causing damage to the package or interfering with the connection between the package and the circuit board.

In TAB (Tape Automated Bonding) integrated circuit package designs, the leads extend from the package from two or more sides and are attach the package to the circuit board through soldering or other methods known to those skilled in the art. The leads are thin and placed closely together, permitting a higher density interconnect system.

The TAB manufacturing process creates a more fragile connection between the circuit board and the integrated circuit package than do the other common styles of integrated circuit packages mentioned above. Therefore, the direct application of a heat sink to a TAB integrated circuit package creates the risk of damage to the package or to the leads that connect the package to the circuit board. A method and apparatus, therefore, is need to provide mechanical integrity for a cooling device that can be used in conjunction with a TAB integrated circuit package.

SUMMARY OF THE INVENTION

The present invention discloses a method and apparatus for bridging the gap between a component on a printed circuit board and a heat sink such that the amount of mechanical stress placed on the component is reduced, but there is still a thermal connection between the component and the heat sink for dissipation of heat. The invention provides mechanical integrity for delicate component packages, and in doing so allows for the use of a variety of heat sinks to provide cooling.

According to one aspect of the present invention, a cooling cap comprised of a thermally conductive material is mounted on the circuit board, such that the component is located between the circuit board and cooling cap. In one embodiment, a layer of thermally conductive material is deposited between the component and the cooling cap to provide a thermal path from the component to the cooling cap. Risers, which may be either integral to the cooling cap or may be separate elements, are used to lift the cooling cap above the surface of the circuit board so as to provide space for the component.

The present invention provides mechanical integrity to allow active cooling methods to be used for fragile components on a printed circuit board. Additionally, the invention allows for the use of a variety of heat sinks to cool components on a circuit board.

DESCRIPTION OF THE PREFERRED EMBODIMENT

In the following detailed description of the preferred embodiment, reference is made to the accompanying drawings, and a specific embodiment of a way to practice the preferred embodiment is shown by way of illustration. This preferred embodiment is described in specific enough detail to allow those skilled in the art to practice the invention and to understand that other embodiments of the present invention may be practiced without departing from the scope of the present invention. The detailed description is not, therefore, to be taken in a limiting sense, and the present invention is described in the appended claims.

Figure 1:
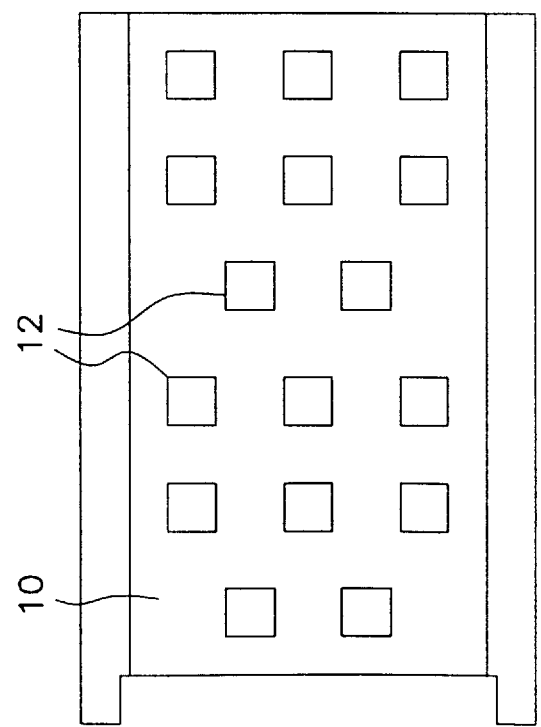
FIG. 1 is a top view of a circuit board showing integrated circuit packages or components mounted on the circuit board.

FIG. 1 is a top view of a printed circuit board (PCB) 10 showing components 12 attached to the PCB 10. Components 12 include a variety of integrated circuits and may include other components that are fragile or that require a means to allow connection to a heat transfer device without putting pressure on the component itself.

Figure 2:
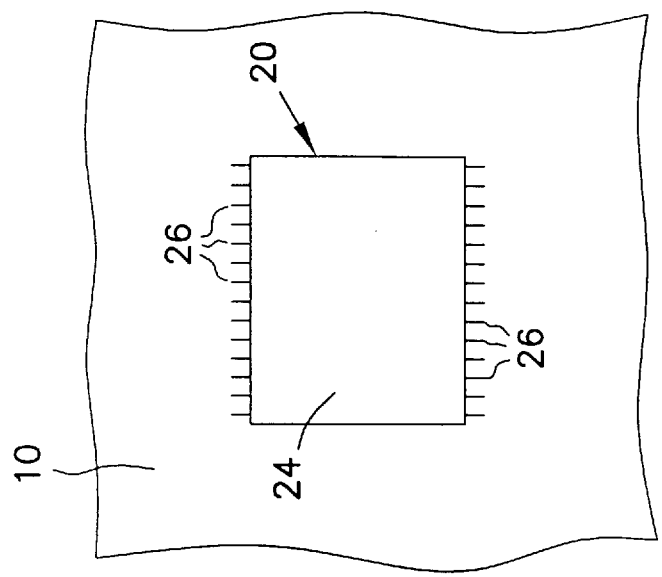
FIG. 2 is a top view of one Tape Automated Bonding integrated circuit package mounted on a circuit board.

FIG. 2 is a top view of one TAB integrated circuit package 20 attached to a PCB 10. In one embodiment, the TAB integrated circuit package 20 includes a top surface 24 and lead pins 26 that extend from the side of package 20 to connect it to the PCB 10. Due to the fragility of the typical TAB integrated circuit package 20, devices used to cool such package 20 must attach to the package without placing a great deal of pressure on it. It should be noted that although the package 20 shown in FIG. 2 has leads extending from only two sides of the package, packages having leads extending from four sides of the package are common and can also be cooled using the method described below.

Figure 3:
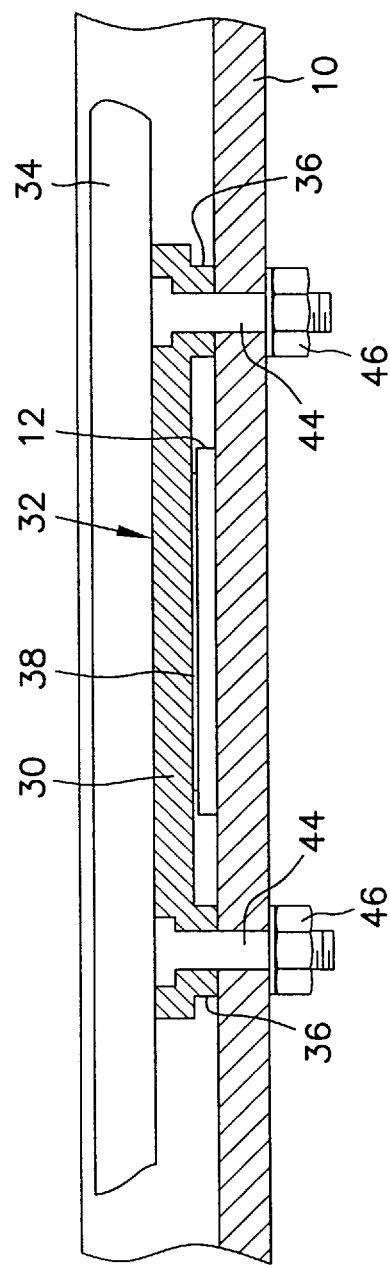
FIG. 3 is a cross-sectional view of the cooling cap mounted on a circuit board with a component between the cooling cap and the circuit board.

FIG. 3 is a cross-sectional view of one embodiment of the cooling cap 30 mounted on PCB 10 with a component 12 between the cooling cap 30 and the PCB 10. The cooling cap 30 is manufactured from a heat conductive material. In one such embodiment, cooling cap 30 is standard aluminum, although it is to be understood that any thermally conductive material may be used without departing from the scope of the invention. The cooling cap 30 contains a top surface 32 that attaches directly to an adjacent heat sink 34. This top surface 32 may be flat, but it may also be any surface geometry that allows it to conform to the surface of a heat sink that attaches to the cooling cap 30. The heat sink 34 may attach to the cooling cap 30 by a variety of methods known to those skilled in the art, including the use of bolts, screws, solder, or epoxy. The heat sink 34 may also attach to the cooling cap 30 through surface-to-surface contact, or the connection may be bridged with a layer of thermal grease, oil, or some other thermally conductive material. In the embodiment shown in FIG. 3, risers 36 are integral to the cooling cap, and function to raise the cooling cap 30 above the PCB 10, so as to form a gap for the component 12. The cooling cap 30 is mounted over the component 12 on the PCB 10, such that the risers 36 are in direct contact with the PCB 10. These risers 36 allow the force applied to the top of the cooling cap 30 to be distributed to the PCB 10 without applying pressure directly to the integrated circuit package or component 12.

Because the component 12 will be attached to PCB 10 and the cooling cap 30 will be attached to PCB 10 as well, cooling cap 30 does not have to be secured to the upper surface of the component 12. A thermally conductive path, however, must exist between component 12 and cooling cap 30. This may be achieved through surface-to-surface contact, provided that the risers 36 may be manufactured to a tight enough tolerance to allow surface-to-surface contact to be a viable method of connecting the cooling cap 30 to the component 12. In one embodiment, as is shown in FIG. 3, a thermally conductive layer 38 is applied between the cooling cap 30 and the component 12. The thermally conductive layer 38 provides a thermally conductive path from the component 12 to the cooling cap 30 that allows free transfer of heat, and also secures the cooling cap 30 to the component 12. The thermally conductive layer 38 may be any variety of thermally conductive material known to those skilled in the art, including thermally conductive epoxy, thermal grease, or oil. In one embodiment, a thermal epoxy manufactured by Loctite Corporation in Newington, Conn. 06111 is used. With the thermally conductive layer 38 in place, heat flows from the component 12, through the thermally conductive layer 38, into the cooling cap 30, into the heat sink 34, and then is finally carried away from the heat sink 34 by either air or liquid.

Figure 4:
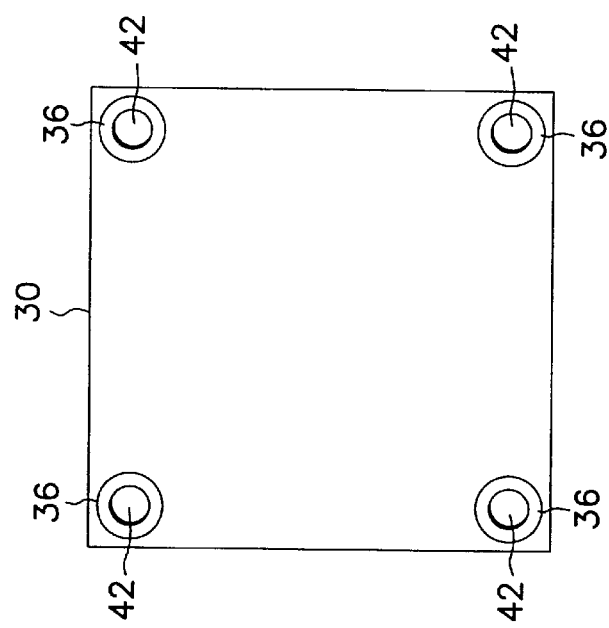
FIG. 4 is a bottom view of a square cooling cap.

FIG. 4 shows a bottom view of an embodiment of FIG. 3 in which cooling cap 30 is square. In one such embodiment, cooling cap 30 fits over the entire surface of component 12 and overhangs component 12 in such a way as to clear the pads to which the leads of component 12 are soldered. Cooling cap 30 includes risers 36 that are integral to the cooling cap 30. In order to attach the cooling cap 30 to the PCB 10, bores 42 are formed in each of the four corners of the cooling cap 30. Referring again to FIG. 3, bolts 44 fit through the bores 42, through holes bored in the PCB 10, and attach the cooling cap 30 to the PCB 10 using nuts 46.

Other means may be used to attach the cooling cap 30 to the PCB 10, including the use of epoxy, so as to eliminate the need for bores in the cooling cap, nuts, and bolts. The surface of the cooling cap 30 adjacent to the component 12 need not be flat, as a layer of thermal epoxy or conductive material could bridge the gap between the component 12 and the cooling cap 30. Similarly, the risers 36 need not be crafted to protrude from the cooling cap 30 at right angles, but may be designed to gradually extend from the cooling cap 30 in a transitional manner.

Figure 5:
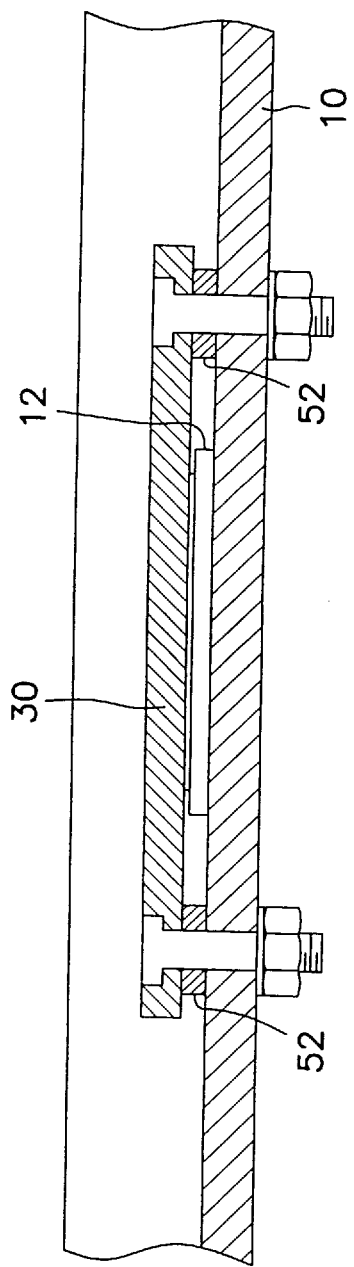
FIG. 5 is a cross-sectional view of a square cooling cap that uses risers that are not integral to the cooling cap.

FIG. 5 is a cross-sectional view of a square cooling cap 30 that uses risers 52 that are not integral to the cooling cap 30. This embodiment of the invention is the same as in FIGS. 3 and 4, except for the separate risers 52. The use of separate risers 52 may be desired for any variety of reasons, including ease of manufacture of the parts. In certain embodiments, therefore, cooling cap 30 could be a flat, square plate and the risers could be small, flat, square or rectangular lifts. The risers 52 could also be washers of the proper size to create the desired space between the PCB 10 surface and the cooling cap 30 for the component 12 to reside therein.

Figure 6:
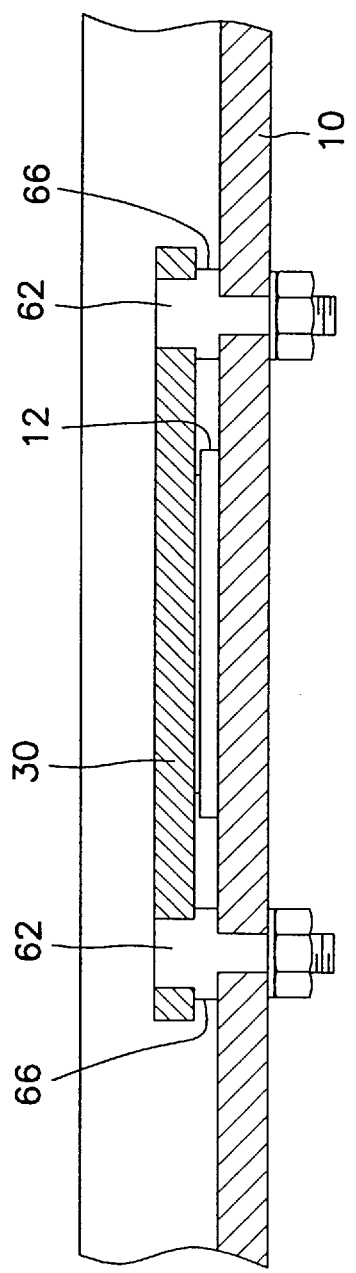
FIG. 6 is a cross-sectional view of a cooling cap design that does not contain risers.

In addition, a cooling cap could be constructed without the use of risers. One such embodiment is shown in FIG. 6. FIG. 6 is a cross-sectional view of a cooling cap 30 that contains no risers. Instead, bolts 62 are used that have raised portions 66 built into the bolts 62, such that when the bolts 62 fit through the cooling cap 30 and the PCB 10, the same results as having separate risers or risers attached to the cooling cap 30 are achieved. In another embodiment, the bores extending through cooling cap 30 could be threaded and cooling cap 30 would be held above PCB 10 by the threads of bolts 62.

Figure 7:
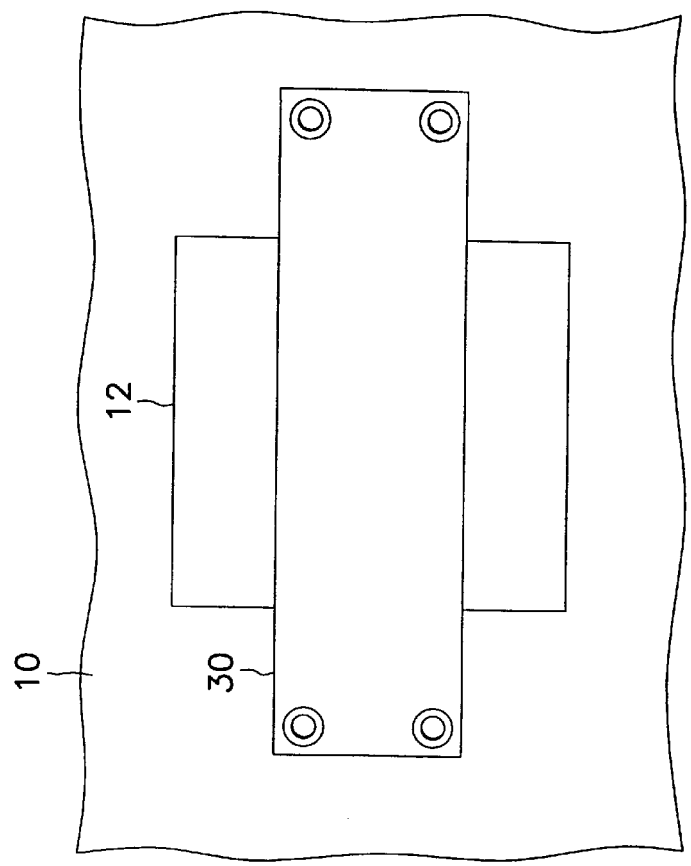
FIG. 7 is a top view of a rectangular band-shaped cooling cap.

Cooling cap 30 does not have to be square. In one embodiment, cooling cap 30 is in the form of a rectangular band which may or may not fit over the entire surface of the component 12. One such embodiment is shown in FIG. 7. In FIG. 7, the cooling cap 30 is in the form of a rectangular band and does not fit over the entire surface of the component 12. This embodiment of the invention could be used where the components 12 are placed close together on the PCB 10 such that there would not be space for other geometric embodiments of the invention, such as a square plate that would require adequate space on all four sides of the component 12 for riser means to contact the PCB 10 surface. The shorter dimension of the cooling cap 30 does not have to fit over the entire surface of the component 12. This dimension may be varied depending on the space limitations of the components 12 on the PCB 10.

Figure 8:
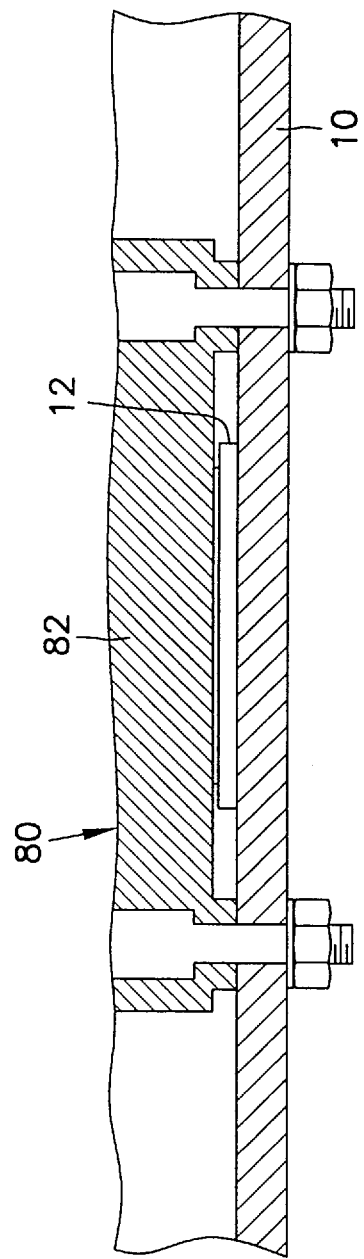
FIG. 8 is a cross-sectional view of a cooling cap design in which the top surface of the cooling cap contains raised portions used to transfer heat directly to air without the use of a heat sink attachment.

FIG. 8 illustrates another alternative embodiment of the present invention, in which the top surface of the cooling cap 80 contains raised portions 82 used to transfer heat directly to air without the use of a heat sink attachment. The raised portions 82 increase the surface area of the cooling cap 80 to facilitate heat transfer. These raised portions 82 may be heat fins, or may be other heat dissipation devices known to those skilled in the art. In this embodiment, the cooling cap 80 functions as both the heat sink itself and as a means for transferring the weight of a heat sink to the PCB 10 without damaging the component 12.

It is to be understood that the above description is intended to be illustrative, and not restrictive. In particular, it should be understood that, in addition to TAB integrated circuit packages, the present method may be used with any other type of component to remove the mechanical stress of applying a heat sink. Furthermore, in addition to the embodiments discussed, other embodiments will be apparent to those of skill in the art upon reviewing the above description. The scope of the invention should, therefore, be determined with reference to the appended claims, along with the full scope of equivalents to which such claims are entitled.

What is claimed is:

1. A method of cooling a component, comprising the steps of:
   providing a cooling cap, wherein the cooling cap comprises a first thermally conductive material;
   attaching the component to a circuit board, wherein the component includes a plurality of leads and wherein the circuit board includes a component-mounting surface and a plurality of traces, wherein the step of attaching includes the steps of:
      placing the component on the circuit board such that the leads extend outward from the component along the component-mounting surface; and
      establishing an electrical connection between one of the leads and one of the plurality of traces; determining a maximum possible gap between the attached component and the cooling cap;
   depositing an amount of second thermally conductive material needed to bridge the maximum possible gap between the attached component and the cooling cap; and
   rigidly suspending said cooling cap over the circuit board such that a thermally conductive path extends from the component through the second thermally conductive material to the cooling cap and such that most of the weight of said cooling cap is transferred to the circuit board rather than falling on the component, wherein the step of rigidly suspending includes the steps of:
      positioning the cooling cap adjacent the component; and
      releasing the cooling cap;
   wherein the cooling cap, when released, remains in thermal contact with the component without lifting the component from the circuit board.

2. The method according to claim 1, wherein step of positioning includes the step of mounting the cooling cap on risers that fit between the circuit board and the cooling cap such that the weight of the cooling cap is supported by the risers.

3. The method according to claim 1, wherein the second thermally conductive material is thermal epoxy.

4. A heat conducting apparatus adapted to conduct heat from a component mounted on a circuit board, comprising:
   a fastener having a head;
   a cooling cap wherein the cooling cap comprises a thermally conductive material and wherein the cooling cap includes risers which hold the cooling cap in a rigid position above the component mounted on the circuit board, wherein the cooling cap further includes a bore for receiving the fastener and a counterbore for accepting the head of the fastener, wherein the bore extends through one of the risers;
   a thermally conductive layer between said cooling cap and the component; and
   a heat sink mounted adjacent to, and in thermal contact with, the cooling cap such that heat is drawn from the thermally conductive layer through the cooling cap and into said heat sink.

5. The heat conducting apparatus of claim 4 wherein said thermally conductive layer is a thermal epoxy.

6. The heat conducting apparatus of claim 4 wherein said attachment means are risers that are separate members from said cooling cap.

7. The heat conducting apparatus of claim 4 wherein said cooling cap further includes raised portions used to increase transfer of heat to air.

8. A circuit module, comprising:
   a printed circuit board having a plurality of traces;
   a tape automated bonding (TAB) component mounted on said printed circuit board, wherein the TAB component includes leads extending from two or more sides of the component to pads on the printed circuit board;
   a cooling cap attached to the printed circuit and held rigidly in place over one of said TAB components;
   a thermally conductive material placed between the cooling cap and the TAB components so as to provide a thermally conductive path between the TAB component and the cooling cap; and
   a heat sink, wherein the heat sink is in thermal contact with the cooling cap such that heat drawn from the TAB component is conducted through the cooling cap and into the heat sink.

9. The circuit module according to claim 8, wherein the heat sink extends over the riser and covers the head of the fastener.

* * * * *

UNITED STATES PATENT AND TRADEMARK OFFICE
CERTIFICATE OF CORRECTION

PATENT NO. : 5,805,418

DATED : September 8, 1998

INVENTOR(S) : Richard B. Salmonson, et cl.

It is certified that error appears in the above-identified patent and that said Letters Patent is hereby corrected as shown below:

At Col. 6, line 23, please delete "attachment means are".

At Col. 6, line 23, please delete "that".

At Col. 6, line 23, please delete "separate members" and insert --separable--.

At Col. 6, line 26, please delete "cooling cap" and insert --heat sink--.

At Col. 6, line 34, please insert --a fastener having a head;--.

At Col. 6, line 36, please delete "one of".

At Col. 6, line 36, please delete "components " and insert --component, wherein the cooling cap includes a riser, a bore for receiving the fastener and a counterbore for accepting the head of the fastener, wherein the bore extends through the riser to the circuit board".

At Col. 6, line 38, please delete "components" and insert --component--.

At Col. 1, line 6, please delete "FIGHTS" and insert --RIGHTS--.

Signed and Sealed this

Twenty-fourth Day of August, 1999

*Attest:*

Q. TODD DICKINSON

*Attesting Officer*     *Acting Commissioner of Patents and Trademarks*